US006483372B1

(12) United States Patent
Bowers

(10) Patent No.: US 6,483,372 B1
(45) Date of Patent: Nov. 19, 2002

(54) LOW TEMPERATURE COEFFICIENT VOLTAGE OUTPUT CIRCUIT AND METHOD

(75) Inventor: Derek F. Bowers, Sunnyvale, CA (US)

(73) Assignee: Analog Devices, Inc., Norwood, MA (US)

(*) Notice: Subject to any disclaimer, the term of this patent is extended or adjusted under 35 U.S.C. 154(b) by 0 days.

(21) Appl. No.: 09/660,864

(22) Filed: Sep. 13, 2000

(51) Int. Cl.[7] .............................................. H03K 17/78

(52) U.S. Cl. ...................................... 327/513; 327/512

(58) Field of Search ................................ 327/512, 513, 327/83, 138, 262, 378, 362, 538, 539, 143

(56) References Cited

U.S. PATENT DOCUMENTS

| | | | | | |
|---|---|---|---|---|---|
| 4,604,899 | A | * | 8/1986 | Yamada et al. | 338/4 |
| 4,633,165 | A | | 12/1986 | Pietkiewicz et al. | 323/314 |
| 5,291,122 | A | | 3/1994 | Audy | 323/313 |
| 5,352,973 | A | | 10/1994 | Audy | 323/313 |
| 5,611,318 | A | * | 3/1997 | Kesler | 123/630 |
| 5,619,122 | A | * | 4/1997 | Kearney et al. | 323/312 |
| 5,686,821 | A | | 11/1997 | Brokaw | 323/273 |
| 5,798,669 | A | * | 8/1998 | Klughart | 327/539 |
| 5,838,192 | A | | 11/1998 | Bowers et al. | 327/541 |
| 5,973,550 | A | | 10/1999 | Bowers et al. | 327/541 |
| 6,002,293 | A | | 12/1999 | Brokaw | 327/540 |
| 6,052,005 | A | * | 4/2000 | Braun | 327/143 |
| 6,104,232 | A | * | 8/2000 | Filip | 327/513 |
| 6,107,868 | A | | 8/2000 | Diniz et al. | 327/543 |
| 6,111,397 | A | * | 8/2000 | Leung | 327/513 |
| 6,181,191 | B1 | * | 1/2001 | Paschal | 327/513 |

OTHER PUBLICATIONS

*Electronics Engineers' Handbook*, Editors, Fink and Christiansen, Third Edition, 1989, pp. 8–47—8–52.

* cited by examiner

*Primary Examiner*—Timothy P. Callahan
*Assistant Examiner*—Linh Nguyen
(74) *Attorney, Agent, or Firm*—Koppel, Jacobs, Patrick & Heybl

(57) ABSTRACT

A low temperature coefficient (TC) voltage output circuit compensates for the TC of a base circuit's output voltage with a compensation circuit that includes first and second current sources with different TCs. The differential between the current sources is applied to a voltage drop circuit that generates a temperature dependent compensation voltage with a TC of opposite polarity to the TC of the base circuit's output. To provide compensation over a desired temperature range, the two current sources are set equal to each other at one temperature within the range, and the compensated voltage output is trimmed at another temperature within the range to the desired output value. The result is a compensated voltage, with a TC of opposite polarity to that of the base circuit's output, which combines with the base circuit output to yield a low TC compensated output. The compensation scheme is particularly useful for voltage references.

54 Claims, 2 Drawing Sheets

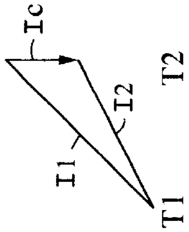
Fig. (3a)
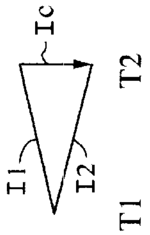
Fig. (3b)
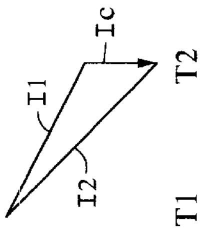
Fig. (3c)
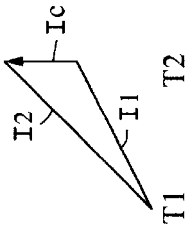
Fig. (4a)
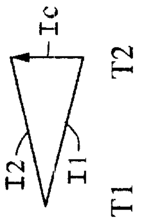
Fig. (4b)
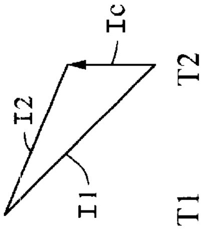
Fig. (4c)
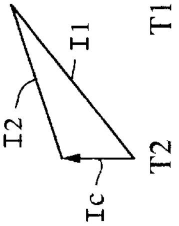
Fig. (5a)
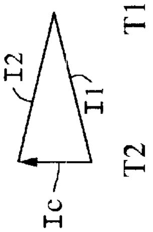
Fig. (5b)
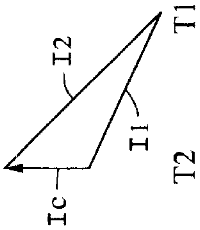
Fig. (5c)
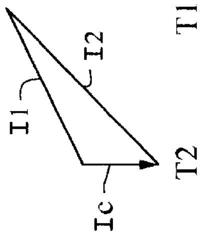
Fig. (6a)
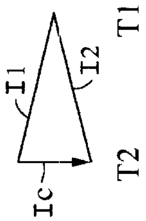
Fig. (6b)
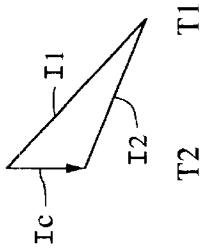
Fig. (6c)

LOW TEMPERATURE COEFFICIENT VOLTAGE OUTPUT CIRCUIT AND METHOD

BACKGROUND OF THE INVENTION

1. Field of the Invention

This invention relates to low temperature coefficient voltage output circuits, and more particularly to providing temperature compensation to a base circuit which produces a preliminary output voltage having a temperature coefficient of known polarity.

2. Description of the Related Art

Voltage reference circuits provide a fixed voltage for purposes such as regulated power supplies and comparison with other voltages. It is important that the output voltage of the reference circuit be made temperature invariant, to the extent practical. This is typically done by measuring the reference's output voltage at high and low temperatures, and then trimming the circuit to compensate for changes in the output voltage between the two measurement temperatures.

In practice, multiple voltage references in integrated circuit (IC) form are typically provided on a single wafer, the voltage measurements at the high and low temperatures are taken at the wafer level, and the individual reference circuits are then trimmed to reduce their temperature dependency, also at the wafer level. Other circuits also require some form of temperature compensation to maintain a substantially temperature invariant voltage level. One example is the offset voltage for an operational amplifier.

There are several problems with this approach. First, the wafers are typically held on a chuck, and the chuck temperature is commonly directly sensed to obtain an indication of the wafer temperature. This requires that the chuck temperature at which the voltage is read be accurately known, which is difficult to do in a production environment. Furthermore, although the chuck temperature is generally close to that of the wafer, the two temperatures are usually not exactly equal, which leads to further inaccuracies. While the wafer temperature can be read directly, this is expensive to do. Also, it is necessary to keep track of which voltage and temperature measurements go with which die on a given wafer, and among the dies of different wafers. Again, this is difficult to do in a production environment.

SUMMARY OF THE INVENTION

The present invention seeks to provide a voltage output circuit with a low temperature coefficient (TC), and an associated temperature compensation method which eliminates the need for both accurate temperature measurement, and for keeping track of the different dies and wafers and their associate voltage and temperature measurements.

These goals are achieved with a voltage output circuit that includes a base circuit which produces a preliminary output voltage having a TC of one polarity, and a compensation circuit having a pair of current sources with different TCs that are connected to compensate for the TC of the base circuit's output voltage (Vo) so as to yield a compensated Vo with a lower TC than the preliminary Vo TC. The differential between the currents of the two current sources is transformed to a voltage drop which has a TC of opposite polarity to the TC for the base circuit's Vo. The voltage drop is combined with the base circuit Vo to yield the compensated Vo.

In a preferred embodiment, the voltage drop circuit is implemented with a resistor connected to receive a current that varies with the differential between the two current sources. The resistor produces a compensation voltage with a TC that approximates, but is of opposite polarity to, the preliminary Vo TC.

To provide a compensated Vo over a predetermined temperature range, the current sources are first trimmed at one temperature level within the range, preferably at one end of the range, so that they are substantially equal in absolute value and thereby cancel, producing zero compensation voltage. Then, at another temperature within the range, preferably at the opposite end of the range, the voltage drop resistor is trimmed to set the compensated Vo at the desired value.

One of the current sources can have a positive TC and the other a negative TC, or the current sources can both have positive or negative TCs, so long as the TC of one source differs from that of the other in a direction and by an amount that produces a compensation voltage of the desired polarity and magnitude. In the case of a voltage reference circuit, the compensated Vo is amplified by an output buffer amplifier. The amplifier is trimmed to produce a desired reference voltage at the first temperature setting, at which the current sources are set equal, and continues to provide the same or a close reference voltage as the temperature varies.

These and other features and advantages of the invention will be apparent to those skilled in the art from the following detailed description, taken together with the accompanying drawings.

BRIEF DESCRIPTION OF THE DRAWINGS

FIGS. 3(*a*), 3(*b*) and 3(*c*) are vector diagrams illustrating the nature of the temperature compensation performed first at a low temperature and then at a higher temperature to obtain a compensation voltage with a positive TC, for three different combinations of current source TC polarities;

FIGS. 4(*a*), 4(*b*) and 4(*c*) are vector diagrams illustrating the nature of the temperature compensation performed first at a low temperature and then at a higher temperature to obtain a compensation voltage with a negative TC, for three different combinations of current source TC polarities;

FIGS. 5(*a*), 5(*b*) and 5(*c*) are vector diagrams illustrating the nature of the temperature compensation performed first at a high temperature and then at a lower temperature to obtain a compensation voltage with a positive TC, for three different combinations of current source TC polarities;

FIGS. 6(*a*), 6(*b*) and 6(*c*) are vector diagrams illustrating the nature of the temperature compensation performed first at a high temperature and then at a lower temperature to obtain a compensation voltage with a negative TC, for three different combinations of current source TC polarities.

DETAILED DESCRIPTION OF THE INVENTION

Figure 1:
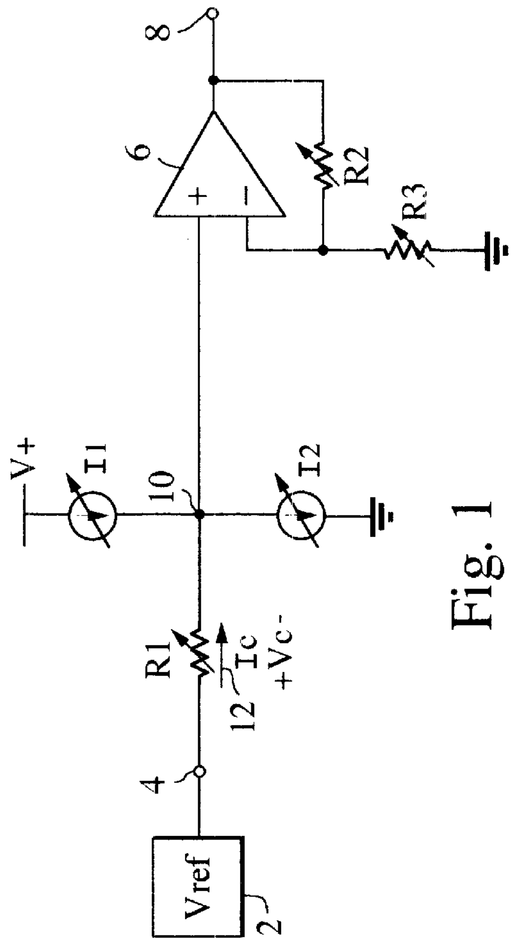
FIG. 1 is a schematic diagram of a voltage reference circuit which incorporates the invention.

The invention uses the difference in current from two current sources having different TCs to compensate for temperature induced changes in a voltage output from a base circuit. FIG. 1 illustrates the invention as applied to a voltage reference circuit 2, which produces an uncompensated Vo at a preliminary output terminal 4. Several different kinds of voltage reference circuits are in common use, such as buried zener, band-gap and MOS (IGFET) references. These types of circuits are well known and are described, for example, in Fink and Christiansen, ed., *Electronics Engineers' Handbook, third edition,* McGraw-Hill, 1989, pages 8–47 to 8–52.

The voltage reference 2 produces a preliminary Vo at terminal 4 with a TC of known polarity. For example, a buried zener reference usually has a positive TC, while a band-gap reference can be given either a positive or a negative TC by resistor scaling. After temperature compensation by the invention in the manner described below, the reference voltage Vo is applied to an operational amplifier 6 which includes a gain setting feedback circuit consisting of resistors R2 and R3, with R2 connected between the op amp output terminal 8 and its inverting input, and R3 connected between the inverting input and ground. The amplifier's gain is set by the usual formula (R2+R3)/R3. One or both of R2 and R3 are made trimmable so that the gain can be adjusted.

The temperature compensation circuit consists of a pair of current sources I1 and I2, at least one of which is trimmable, connected in series between two voltage supply buses, illustrated as V+ and ground. The node 10 between the two current sources establishes a compensated Vo terminal, at which a TC compensated Vo from the voltage reference is provided and fed into the non-inverting input of op amp 6. A voltage drop circuit, preferably implemented as a trimmable resistor R1, is connected between preliminary and compensated Vo terminals 4 and 10. The current sources I1 and I2 are oriented so that I1 delivers current to, and I2 draws current from, the compensated Vo terminal 10. One of the current sources has a TC that is more positive than the TC for the other current source; whether this is I1 or I2 depends upon whether the voltage reference 2 produces a preliminary Vo with a positive or a negative TC.

A voltage drop circuit, preferably in the form of a trimmable resistor R1, is connected between preliminary and compensated Vo terminals 4 and 10 to provide the desired TC compensation. When I2 exceeds I1, the current differential is drawn through R1 from preliminary Vo terminal 4 to compensated Vo terminal 10, in the direction indicated by arrow 12 for the compensation current Ic, and a compensation voltage drop Vc is produced from preliminary Vo terminal 4 to compensated Vo terminal 10. This causes the voltage at terminal 10 to be less than that at terminal 4. Conversely, when I1 exceeds I2, Ic flows in the opposite direction through R1, from terminal 10 to terminal 4. The Vc drop is also from terminal 10 to terminal 4, causing the voltage at terminal 10 to exceed that at terminal 4. In one particular implementation to compensate a voltage reference having a TC of about +125 ppm/°C., I1 and I2 had nominal room temperature values of 15 microamperes and 7.5 microamperes, respectively, both had a nominal value of 10 microamperes at 125° C., and R1 had a trimming range of 500–1,000 ohms.

Figure 2:
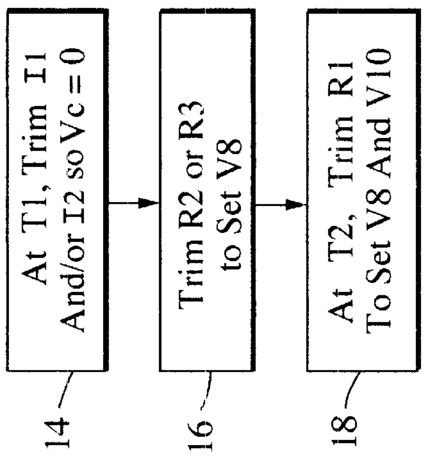
FIG. 2 is a flow diagram of a procedure for establishing a correct TC compensation level.

FIG. 2 is a block diagram illustrating the sequence used to establish a TC compensated Vo over a desired temperature range, typically 25° C.–125° C. for voltage references. At one temperature T1 within the range, preferably at one end of the range, I1 and/or I2 is trimmed so that I1 and I2 are equal. The current flowing into compensated Vo terminal 10 from I1 is therefore balanced by the current flowing out of the terminal to I2, and both Ic and Vc equal zero (block 14). Then, for the case for a voltage reference in which the ultimate output voltage is the output of op amp 6, rather than the compensated Vo at terminal 10, feedback resistor R2 or R3 is trimmed at temperature T1 to set the op amp output voltage at terminal 8 at the desired reference voltage value (block 16). The temperature is then changed to a difference level T2 within the desired range, preferably at the opposite end of the range from T1. At T2, compensation resistor R1 is trimmed to set the compensated Vo at terminal 10 so that the op amp Vo is at the same desired level as that established for T1 (block 18). However, since zero current flows through R1 and Vc is zero at T1, the change in R1 due to trimming the resistor does not change the compensated Vo at terminal 10 from its value at T2. Thus, the same compensated value of Vo is established at both ends of the desired temperature range.

This setup process is performed at the wafer level. At no time during the process is it necessary to know the exact temperature, since the precise value of neither T1 or T2 is critical. An indication of the wafer temperature can therefore be obtained inexpensively by sensing the temperature of the wafer support chuck.

To the extent the voltage reference TC is linear, the compensated Vo will remain at the same desired value for all intermediate temperatures between T1 and T2. In practice, a voltage reference's output will typically exhibit a slight "bow" between two different temperatures, rather than a perfectly linear TC.

The compensation process can be performed in numerous ways. FIG. 3(*a*) illustrates a procedure that can be used to compensate for a negative TC voltage reference. For purposes of this invention, a "negative" TC is one at which the absolute value of a parameter decreases with increasing temperature, while a "positive" TC is one at which the absolute value of the parameter increases with increasing temperature. All values of I1 and I2 in FIGS. 3(*a*)–6(*c*) are assumed to be positive, regardless of the sign of their TCs.

I1 and I2 are set equal to each other at a low temperature T1 within the desired range; both I1 and I2 have positive TCs, with the I1 TC more positive than I2. I1 will therefore exceed I2 at the higher temperature T2 at which R1 is trimmed to set the compensated Vo at the desired value. At T2 Ic flows through R1 from right to left (in FIG. 1), indicated by a downward directed arrow in FIG. 3(*a*). This produces a Vc that causes the compensate Vo at terminal 10 to exceed the preliminary Vo at terminal 4. Since I1 increases with temperature more rapidly than I2, Vc has a positive TC to compensate the voltage reference's negative TC.

The procedure illustrated in FIG. 3(*b*) is similar to FIG. 3(*a*), except the TC for I2 is now negative while the TC for I1 remains positive but at a lower level. Ic has the same magnitude and polarity as in FIG. 3(*a*), resulting in the same value of compensated Vo.

In FIG. 3(*c*) both I1 and I2 have negative TCs, but again the TC for I1 is more positive than for I2, and by the same amount as before. Ic will therefore have the same magnitude and polarity as in FIGS. 3(*a*) and 3(*b*), resulting in the same value of compensated Vo.

The procedure illustrated in FIGS. 4(*a*)–4(*c*) establishes a Vc with a negative TC, and is useful in compensating a positive TC voltage reference. I1 and I2 are again set equal to each other at a low temperature T1, and RI is trimmed to obtain the desired value for the compensated Vo at the higher temperature T2. In this case, however, I2 has a TC that is more positive than the TC of I1, resulting in Ic flowing through R1from left to right (in FIG. 1) at T2. This produces a voltage drop across R1 that causes the compensated Vo at terminal 10 to be less than the preliminary Vo at terminal 4. The voltage reference output at terminal 4 will be equal to the desired Vo at T1 and, since no current flows through R1 at this temperature, the compensated Vo at terminal 10 will also be at the desired level. As the voltage reference preliminary Vo at terminal 4 progressively diverges from the desired value with increasing temperature, the Ic current through R1 also progressively increases to provide an increasing level of compensation.

FIGS. 4(*b*) and 4(*c*) are similar to FIGS. 3(*b*) and 3(*c*), respectively, but again with I2 having a more positive TC than I1. The result is an Ic of equal magnitude and polarity to FIG. 4(*a*).

In FIG. 5(*a*) the setup procedure is reversed, with I1 and I2 first set equal to each other at a high temperature T1 within the desired range, and R1 then trimmed to set the compensated Vo at the desired value at a lower temperature T2. (In this nomenclature T1 is always the first temperature, at which I1 is set equal to I2, and T2 is always the second temperature at which R1 is trimmed, regardless of which temperature is higher or lower.) In this case I1 has a more positive TC than I2. The result is an Ic that flows from left to right through R1 at T2, yielding a compensated Vo that is greater than the preliminary Vo from the voltage reference. This procedure is suitable for compensating a voltage reference with a negative TC.

In FIG. 5(*a*) both I1 and I2 have positive TCs. FIGS. 5(*b*) and 5(*c*) illustrate the situation with I1 having a positive and I2 a negative TC, and both I1 and I2 having negative TCs, respectively. In both cases Ic has the same magnitude and polarity as in FIG. 5(*a*) (assuming equal differences between the TCs of I1 and I2 in the three cases).

FIGS. 6(*a*), 6(*b*), and 6(*c*) illustrate situations similar to FIGS. 5(*a*), 5(*b*) and 5(*c*), respectively, but with I2 having a higher TC than I1. This results in Ic having the same magnitude as in FIGS. 5(*a*)–5(*c*), but with a reversed polarity flowing through Rl from right to left at T2. This results in an increase in the compensated Vo level at terminal 10 relative to the preliminary Vo level at terminal 4 at the lower temperature T2, which then progressively reduces to a zero differential as the temperature increases back to T1. This negative TC for Vc is suitable for compensating a voltage reference having a positive TC.

Figure 7:
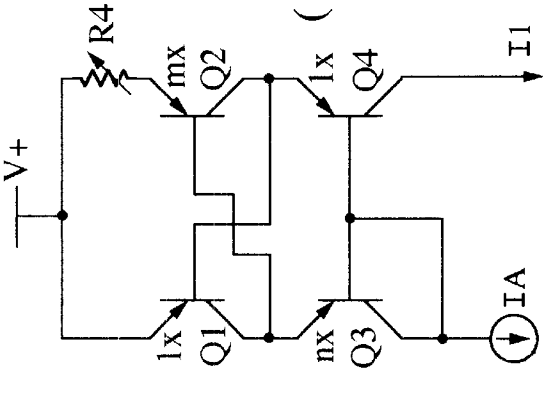
Fig. 7 ( Prior Art )

Trimmable current sources with positive and negative TCs are well known. FIG. 7 illustrates one such circuit with a positive TC. A similar circuit, but with npn transistors, is described in U.S. Pat. No. 3,930,172 to Dobkin assigned to National Semiconductor Corp. A pair of pnp transistors Q1 and Q2 are connected with their bases and collectors cross-coupled and their emitters connected to a positive voltage bus V+, with a trimming resistor R4 between V+ and the emitter of Q2. The emitter of Q1 is scaled to a unity area of 1x while the emitter of Q2 is scaled to an area of mx, either by implementing the transistor with a single larger emitter or with multiple emitters. The collectors of Q1 and Q2 are cascoded respectively with additional pnp transistors Q3 and Q4, with the base and collector of Q3 connected together in a diode configuration and a common base connection for Q3 and Q4. The emitter area of Q3 is scaled to nx, while the emitter area of Q4 is 1x.

A current source IA draws current from the common base/collector connection for Q3. The magnitude of IA is not critical, so long as it is sufficient to keep all of the transistors conductive. The current source I1 is provided from the collector of Q4. I1 is approximately equal to kTln(nm)/qR4, where k is Boltzmann's constant, T is temperature in Kelvin and q is the electronic charge. R4 can be trimmed to obtain a desired value for I1 . Since I1 is directly proportional to T, it has a PTAT (proportional to absolute temperature) characteristic. Its TC can be varied by making the resistance value of R4 temperature dependent, with the value of TC for I1 varying with the degree of temperature dependence for R4. Temperature dependent resistors are well known. If R4 is given a negative TC the TC of I1 will become more positive, and conversely if R4 has a positive TC the TC of I1 will become less positive. A similar circuit could be used to generate I1 with a positive TC by substituting npn transistors for the pnp devices and "flipping" the circuit over.

Figure 8:
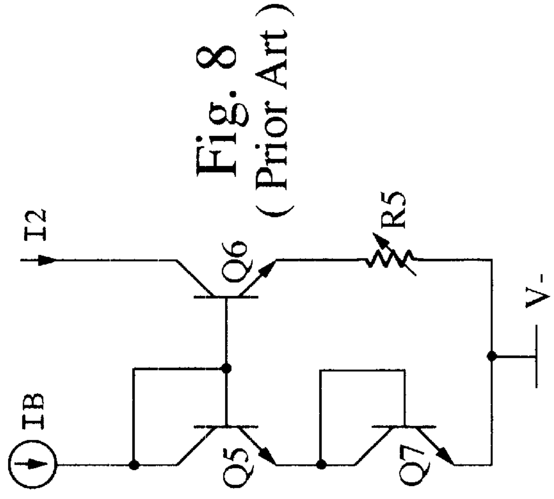
Fig. 8 ( Prior Art )
FIGS. 7 and 8 are schematic diagrams of known current sources having positive and negative TCs, respectively.

FIG. 8 illustrates a known circuit that can be used to generate I2 with a negative TC. A pair of npn transistors Q5 and Q6 have a common base connection, with the collector and base of Q5 connected together in a diode configuration. The emitter of Q5 supplies another diodeconnected npn transistor Q7, while the emitter of Q6 is connected to a trimming resistor R5. The emitter of Q7 and the opposite side of R5 are connected to a negative voltage bus V−. A current source IB is connected the common base/collector connection for Q5 to keep all of the transistors conductive, while I2 is established as the collector current for Q6. The exact value of I2 at a given temperature is set by trimming R5.

The value of I2 is given by the following expression, in which Vbe is the transistor base-emitter voltage:

$$(Vbe_{Q5}+Vbe_{Q7}-Vbe_{Q6})R5,$$

which is approximately equal to Vbe/R5, with Vbe for an npn transistor typically about 600 mV and having a TC of about −2 mV/°C. In a manner similar to the circuit of FIG. 7, the TC for I2 can be varied by making the resistance value of R5 temperature dependent. If R5 is given a negative TC the TC of I2 will become less negative, and conversely if R5 has a positive TC the TC of I2 will become more negative.

While several embodiments of the invention have been shown and described, numerous variations and alternate embodiments will occur to those skilled in the art. For example, the same approach could be used to provide TC compensation for the input offset voltage (Vos) of an operational amplifier, which typically can have either a positive or a negative TC. The amplifier could be skewed to force a TC that is always of the same polarity. In this case the input Vos prior to compensation corresponds to the "preliminary Vo" of the voltage reference for purposes of this description. Accordingly, it is intended that the invention be limited only in terms of the appended claims.

I claim:

1. A low temperature coefficient (TC) voltage output circuit, comprising:

a base circuit which produces a preliminary output voltage (Vo) having a TC of one polarity, and a compensation circuit connected to compensate the base circuit's Vo TC to yield a compensated Vo having a lower TC than said preliminary Vo TC, said compensation circuit comprising first and second current sources having different TCs and connected to provide said Vo TC compensation, said compensation circuit further comprising a voltage drop circuit connected to receive a current which varies with the differential between said current sources, and to produce a compensation voltage which cooperates with said base circuit Vo to yield said compensated Vo, wherein said current sources provide a current to said voltage drop circuit that causes said compensation voltage to have a TC substantially equal in absolute value, but of opposite polarity, to said preliminary Vo TC.

2. The low TC Vo circuit of claim 1, said voltage drop circuit comprising a resistor circuit.

3. The low TC Vo circuit of claim 1, for providing a compensated Vo over a predetermined temperature range, wherein the currents from said first and second sources are substantially equal in absolute value at a first temperature within said range.

4. The low TC Vo circuit of claim 3, wherein said compensation circuit produces a compensation voltage at a second temperature within said range which combines with said preliminary Vo to produce a compensated Vo at said second temperature substantially equal to the compensated Vo at said first temperature.

5. The low TC Vo circuit of claim 1, for providing a compensated Vo over a predetermined temperature range, wherein said compensation circuit yields substantially equal compensated Vo's at opposite ends of said range.

6. The low TC Vo circuit of claim 1, wherein said base circuit comprises a voltage reference circuit.

7. A low temperature coefficient (TC) voltage output circuit, comprising:

a base circuit which produces a preliminary output voltage (Vo) having a TC of one polarity, and a compensation circuit connected to compensate the base circuit's Vo TC to yield a compensated Vo having a lower TC than said preliminary Vo TC, said compensation circuit comprising first and second current sources having different TCs and connected to provide said Vo TC compensation, wherein both of said current sources have positive TC's.

8. The low TC Vo circuit of claim 1, wherein one of said current sources has a positive TC and other has a negative TC.

9. A low temperature coefficient (TC) voltage output circuit, comprising:

a base circuit which produces a preliminary output voltage (Vo) having a TC of one polarity, and a compensation circuit connected to compensate the base circuit's Vo TC to yield a compensated Vo having a lower TC than said preliminary Vo TC, said compensation circuit comprising first and second current sources having different TCs and connected to provide said Vo TC compensation, wherein both of said current sources have negative TC's.

10. A low temperature coefficient (TC) voltage output circuit, comprising:

a base circuit which produces a preliminary output voltage (Vo) having a TC of one polarity at a preliminary Vo terminal, a voltage drop circuit that is connected to said preliminary Vo terminal and responds to a current to produce a voltage drop that combines with said preliminary Vo to yield a compensated Vo, and first and second current sources that produce currents with different TC's, said current sources connected in circuit with said voltage drop circuit to cause said voltage drop circuit to produce a voltage drop with a TC polarity opposite to the polarity of said preliminary Vo TC polarity.

11. The low TC Vo circuit of claim 10, wherein said voltage drop circuit is connected between said preliminary Vo terminal and a compensated Vo terminal, one of said current sources is connected to supply current to said compensated Vo terminal and the other of said current sources is connected to draw current from said compensated Vo terminal.

12. The low TC Vo circuit of claim 11, said voltage drop circuit comprising a resistor circuit.

13. The low TC Vo circuit of claim 12, wherein said base circuit produces a preliminary Vo with a positive TC, and the current source which draws current from said compensated Vo terminal has a TC that is more positive than the TC of said first current source.

14. The low TC Vo circuit of claim 12, where said base circuit produces a preliminary Vo with a negative TC, and the current source which draws current from said compensated Vo terminal has a TC that is more negative than the TC of said first current source.

15. The low TC Vo circuit of claim 12, for providing a compensated Vo over a predetermined temperature range, wherein said first and second current sources produce a substantially zero current flow through said resistor circuit at a first temperature within said range.

16. The low TC Vo circuit of claim 15, wherein said first and second current sources provide a current through said resistor circuit at a second temperature within said range to produce a voltage drop across said resistor circuit which is substantially equal in magnitude, and of opposite polarity, to the change in said preliminary Vo from said first to said second temperatures.

17. The low TC Vo circuit of claim 12, for providing a compensated Vo over a predetermined temperature range, wherein said first and second current sources provide currents through said resistor circuit, at the opposite ends of said range, to produce a change in the voltage drop across said resistor circuit, between the opposite ends of said range, which is equal in magnitude, and of opposite polarity, to the change in the preliminary Vo between said opposite ends of the range.

18. The low TC Vo circuit of claim 10, wherein said base circuit comprises a voltage reference circuit.

19. A low temperature coefficient (TC) voltage output circuit, comprising:

a base circuit which produces a preliminary output voltage (Vo) having a TC of one polarity at a preliminary Vo terminal, a voltage drop circuit that is connected to said preliminary Vo terminal and responds to a current to produce a voltage drop that combines with said preliminary Vo to yield a compensated Vo, first and second current sources that produce currents with different TCs, said current sources connected in circuit with said voltage drop circuit to cause said voltage drop circuit to produce a voltage drop with a TC polarity opposite to the polarity of said preliminary Vo TC, and a buffer amplifier having an input connected to receive said compensated Vo.

20. The low TC Vo circuit of claim 10, wherein both of said current sources have positive TC's.

21. The low TC Vo circuit of claim 10, wherein one of said current sources has a positive TC and the other has a negative TC.

22. The low TC Vo circuit of claim 10, wherein both of said current sources have negative TC's.

23. A temperature compensation circuit, comprising:

a voltage drop circuit having an input terminal for receiving a voltage to be temperature compensated, and an output terminal, said voltage drop circuit producing a voltage drop that varies with the current flowing through it, and first and second current sources having different respective temperature coefficients (TC's), one of said current sources connected to supply current to and the other of said current sources connected to draw current from said voltage drop circuit, said current sources producing a net current flow through said voltage drop circuit that produces a voltage drop with a non-zero TC across said circuit, wherein both of said current sources have positive TC's.

24. A temperature compensation circuit, comprising:

a voltage drop circuit having an input terminal for receiving a voltage to be temperature compensated, and an output terminal, said voltage drop circuit producing a voltage drop that varies with the current flowing through it, and first and second current sources having different respective temperature coefficients (TC's), one of said current sources connected to supply current to and the other of said current sources connected to draw current from said voltage drop circuit, said current sources producing a net current flow through said voltage drop circuit that produces a voltage drop with a non-zero TC across said circuit, wherein both of said current sources have negative TC's.

25. A method of compensating for temperature induced changes in the output voltage (Vo) of a base circuit which has a temperature coefficient (TC) of one polarity, comprising:

establishing two currents that have different TCs, establishing a differential between said two currents, transforming said current differential to a voltage drop having a TC of opposite polarity to said base circuit Vo TC, and combining said base circuit Vo and said voltage drop to yield a compensated Vo having a lower TC than said base circuit Vo TC.

26. The method of claim 25, wherein said voltage drop is established by applying said current differential to resistor circuit.

27. The method of claim 26, further comprising the step of trimming said resistor circuit to obtain a desired Vo value at a predetermined temperature.

28. The method of claim 27, for providing compensation over a predetermined temperature range, wherein said current differential establishes a substantially zero voltage drop at a first temperature within of said range, and said resistor circuit is trimmed at a second temperature within said range.

29. The method of claim 28, wherein said two currents are established by first and second current sources, respectively, further comprising the step of trimming at least one of said current sources at said first temperature to establish said substantially zero voltage drop.

30. A method of compensating, over a predetermined temperature range, for temperature induced changes in the output voltage (Vo) of a voltage reference circuit which has a temperature coefficient (TC) of one polarity, comprising:

establishing two currents that have different TCs by first and second current sources, respectively, establishing a differential between said two currents, transforming said current differential to a voltage drop having a TC of opposite polarity to said voltage reference circuit Vo TC by applying said current differential to a resistor circuit, trimming said resistor circuit to obtain a desired Vo value at a predetermined temperature, wherein said current differential establishes a substantially zero voltage drop at a first temperature within said range, said resistor circuit is trimmed at a second temperature within said range, and at least one of said current sources is trimmed at said first temperature to establish said substantially zero voltage drop, combining said voltage reference circuit Vo and said voltage drop to yield a compensated Vo having a lower TC than said voltage reference circuit Vo TC, providing an operational amplifier having a resistive feedback circuit to amplify said voltage reference circuit Vo, and trimming said resistive feedback circuit at said first temperature to establish a desired output voltage from said amplifier.

31. A method of compensating for temperature induced changes in the output voltage (Vo) of a base circuit which has a temperature coefficient (TC) of known polarity, comprising:

establishing a differential between the currents of two current sources which have different TCs, using said differential to establish a compensation voltage having a TC of opposite polarity to the TC of said base circuit, and compensating said base circuit Vo with said compensation voltage.

32. The method of claim 31, wherein said current sources are set equal to each other at one temperature, and the compensated base circuit Vo is set equal to a desired value at another temperature.

33. The low TC Vo circuit of claim 1, wherein said first and second current sources have TCs with different absolute values.

34. The low TC Vo circuit of claim 10, wherein said first and second current sources have TCs with different absolute values.

35. The method of claim 25, wherein said two currents are established with TCs of different respective absolute values.

36. The method of claim 31, wherein said two current sources produce currents that have TCs of different absolute values.

37. The low TC Vo circuit of claim 1, said compensation circuit further comprising a voltage drop circuit connected to receive a current which varies with the differential between said current sources, and to produce a compensation voltage which cooperates with said voltage reference circuit Vo to yield said compensated Vo.

38. A low temperature coefficient (TC) voltage output circuit, comprising:

a base circuit which produces a preliminary output voltage (Vo) having a TC of one polarity, and a compensation circuit connected to compensate the base circuit's Vo TC to yield a compensated Vo having a lower TC than said preliminary Vo TC, said compensation circuit comprising first and second current sources having different TCs and connected to provide said Vo TC compensation, said compensation circuit further comprising a voltage drop circuit connected to receive a current which varies with the differential between said current sources, and to produce a compensation voltage which cooperates with said voltage reference circuit Vo to yield said compensated Vo, wherein said current sources provide a current to said voltage drop circuit that causes said compensation voltage to have a TC substantially equal in absolute value, but of opposite polarity, to said preliminary Vo TC.

39. A low temperature coefficient (TC) voltage output circuit, comprising:

a voltage reference circuit which produces a preliminary output voltage (Vo) having a non-zero TC of one polarity at a preliminary Vo terminal, a voltage drop circuit that is connected to said preliminary Vo terminal and responds to a current to produce a voltage drop that combines with said preliminary Vo to yield a compensated Vo, and first and second current sources that produce currents with different TCs, said current sources connected in circuit with said voltage drop circuit to cause said voltage drop circuit to produce a voltage drop with a TC polarity opposite to the polarity of said preliminary Vo TC polarity.

40. The low TC Vo circuit of claim 39, wherein said voltage drop circuit is connected between said preliminary Vo terminal and a compensated Vo terminal, one of said current sources is connected to supply current to said compensated Vo terminal and the other of said current sources is connected to draw current from said compensated Vo terminal.

41. The low TC Vo circuit of claim 40, said voltage drop circuit comprising a resistor circuit.

42. The low TC Vo circuit of claim 41, for providing a compensated Vo over a predetermined temperature range, wherein said first and second current sources produce a substantially zero current flow through said resistor circuit at a first temperature within said range.

43. The low TC Vo circuit of claim 42, wherein said first and second current sources provide a current through said resistor circuit at a second temperature within said range to produce a voltage drop across said resistor circuit which is substantially equal in magnitude, and of opposite polarity, to the change in said preliminary Vo from said first to said second temperatures.

44. The low TC Vo circuit of claim 41, for providing a compensated Vo over a predetermined temperature range, wherein said first and second current sources provide currents through said resistor circuit, at the opposite ends of said range, to produce a change in the voltage drop across said resistor circuit, between the opposite ends of said range, which is equal in magnitude, and of opposite polarity, to the change in the preliminary Vo between said opposite ends of the range.

45. The low TC Vo circuit of claim 39, wherein said first and second current sources have TCs with different absolute values.

46. A method of compensating for temperature induced changes in the output voltage (Vo) of a voltage reference circuit which has a non-zero temperature coefficient (TC) of one polarity, comprising:

establishing two currents that have different TCS, establishing a differential between said two currents, transforming said current differential to a voltage drop having a TC of opposite polarity to said base circuit Vo TC, and combining said voltage reference circuit Vo and said voltage drop to yield a compensated Vo having a lower TC than said base circuit Vo TC.

47. The method of claim 46, wherein said voltage drop is established by applying said current differential to a resistor circuit.

48. The method of claim 47, further comprising the step of trimming said resistor circuit to obtain a desired Vo value at a predetermined temperature.

49. The method of claim 48, for providing compensation over a predetermined temperature range, wherein said current differential establishes a substantially zero voltage drop at a first temperature within of said range, and said resistor circuit is trimmed at a second temperature within said range.

50. The method of claim 49, wherein said two currents are established by first and second current sources, respectively, further comprising the step of trimming at least one of said current sources at said first temperature to establish said substantially zero voltage drop.

51. The method of claim 46, wherein said two currents are established with TCs of different respective absolute values.

52. A method of compensating for temperature induced changes in the output voltage (Vo) of a voltage reference circuit which has a non-zero temperature coefficient (TC) of known polarity, comprising:

establishing a differential between the currents of two current sources which have different TCs, using said differential to establish a compensation voltage having a TC of opposite polarity to the TC of said voltage reference circuit, and compensating said voltage reference circuit Vo with said compensation voltage.

53. The method of claim 52, wherein said current sources are set equal to each other at one temperature, and the compensated voltage reference circuit Vo is set equal to a desired value at another temperature.

54. The method of claim 52, wherein said two current sources produce currents that have TCs of different absolute values.

* * * * *